United States Patent [19]

Schultz

[11] Patent Number: 5,390,420
[45] Date of Patent: Feb. 21, 1995

[54] MR ELEMENT-TO-CONTACT ALIGNMENT TEST STRUCTURE

[75] Inventor: Allan E. Schultz, St. Paul, Minn.

[73] Assignee: Seagate Technology, Inc., Scotts Valley, Calif.

[21] Appl. No.: 198,946

[22] Filed: Feb. 18, 1994

[51] Int. Cl.⁶ ............................................ G01C 15/00
[52] U.S. Cl. .................................. 33/286; 338/32 R
[58] Field of Search ................. 33/286; 324/713, 715; 338/32 R, 32 H

[56] References Cited

U.S. PATENT DOCUMENTS

| | | | |
|---|---|---|---|
| 4,097,802 | 6/1978 | Mahopac | 338/32 R |
| 4,240,748 | 12/1980 | Blanc et al. | 33/286 |
| 4,616,281 | 10/1986 | Nakamura | 338/32 R |
| 4,887,025 | 12/1989 | Re Fiorentin et al. | 324/713 |
| 5,272,445 | 12/1993 | Lloyd et al. | 324/713 |

*Primary Examiner*—William A. Cuchlinski, Jr.
*Assistant Examiner*—G. Bradley Bennett
*Attorney, Agent, or Firm*—Kinney & Lange

[57] ABSTRACT

A device and method for determining alignment accuracy between magnetoresistive elements and contacts of magnetoresistive heads formed on a wafer are disclosed. A first alignment test structure is defined using a first photomask. The first alignment test structure is formed from a first material having a first characteristic sheet resistivity. A second alignment test structure is defined using a second photomask. The second alignment test structure is formed from a second material having a second characteristic sheet resistivity lower than the first characteristic sheet resistivity. The second alignment test structure is formed in contact with the first alignment test structure. A resistance value is dependent upon the first and second characteristic sheet resistivities and upon alignment between the first alignment test structure and the second alignment test structure such that changes in alignment between the first and second alignment test structures result in changes in the resistance value. Changes in the resistance value are indicative of changes in alignment between magnetoresistive elements and contacts formed on the wafer.

10 Claims, 4 Drawing Sheets

MR ELEMENT-TO-CONTACT ALIGNMENT TEST STRUCTURE

BACKGROUND OF THE INVENTION

The invention relates to magnetoresistive recording heads. In particular, the invention relates to a magnetoresistive element-to-contact alignment test structure and method.

A critical parameter in magnetoresistive (MR) recording heads is the alignment between the contacts and the MR elements. Misalignment between the contacts and an MR element causes the MR element's "read center" to shift from its desired position. This in turn causes misalignment between the MR element read center and the write transducer's "write center", thereby decreasing the off-track capabilities of the data head. This is particularly true with respect to MR head designs utilizing slanted contacts and an asymmetric non-rectangular MR element shape. In these MR head designs, misalignment in either of two orthogonal directions causes the read center to shift.

The contacts and MR element layers of an MR head are deposited with the use of photoresist masks or photomasks, which are commonly referred to as reticles. For MR heads there are a number of rows in each reticle. Typically, at the bottom of each reticle is a row of test features which do not become products. The row of test features on each reticle is used for purposes such as determining whether alignment between mask layers is correct, determining film thicknesses, determining completeness of etching, or identifying electrical shorts between layers. In general, analysis of the test features on each reticle is used to determine whether the fabrication process is working properly over the entire wafer.

Because even slight misalignment between MR head mask layers can cause the MR head to function less than optimally, it is necessary to verify alignment of the layers during or after the fabrication process. Visual methods of determining the alignment of reticles from one layer to the next exist. Visual inspection of reticle alignment between layers is a very slow and labor intensive process. Additionally, many of these methods have limited accuracy and leave room for human error. The method of determining alignment accuracy of the present invention is automated and removes the issue of human error due to subjective judgment about the degree of misalignment.

SUMMARY OF THE INVENTION

The present invention is a device and method for determining alignment between contacts and MR elements on MR heads fabricated on a wafer. A first alignment test structure is defined using a first photomask. The first alignment test structure is formed from a first film having a first characteristic sheet resistivity. A second alignment test structure is defined using a second photomask. The second alignment test structure is formed from a second film having a second characteristic sheet resistivity lower than the first characteristic sheet resistivity. A resistance value is dependent upon the first and second characteristic sheet resistivities and upon alignment between the first alignment test structure and the second alignment test structure. The second alignment test structure is formed in contact with the first alignment test structure such that changes in alignment between the first and second alignment test structures results in changes in the resistance value. Changes in the resistance value are indicative of changes in alignment between contacts and MR elements on MR heads on the wafer.

DETAILED DESCRIPTION OF THE PREFERRED EMBODIMENTS

Figure 1:
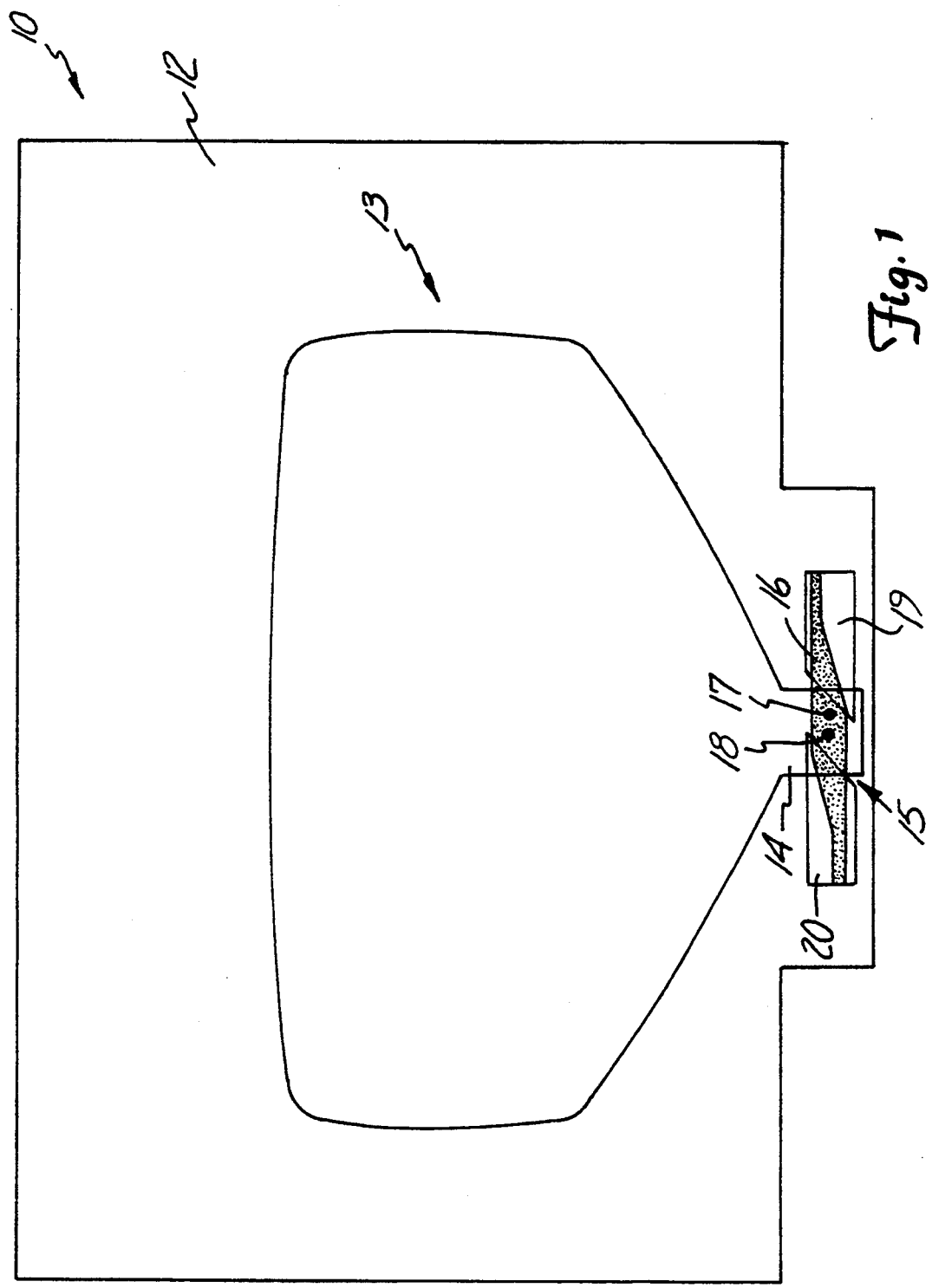
FIG. 1 is a diagrammatic view of a magnetic head with a write transducer and a MR read transducer.

FIG. 1 is a diagrammatic view of magnetic head 10. Magnetic head 10 includes slider 12, write transducer 13 and MR read transducer 15. In FIG. 1, only top pole and yoke 14 of write transducer 13 is shown. Write center 18 of write transducer 13 represents the portion of write transducer 13 which should be aligned over the tracks of the magnetic media so that write transducer 13 can write data onto the tracks.

MR read transducer 15 includes MR element 16 and contacts 19 and 20. MR element 16 has a read center 17, Read center 17 corresponds to the portion of MR element 16 from which the read output signal will be the strongest. Read center 17 may be positioned directly under the write center or at some predetermined offset. However, read center 17 of MR element 16 must be aligned so that it will be positioned directly over the tracks of the magnetic media from which data is to be read during drive operation. To this end, read center 17 and write center 18 need to be accurately aligned so that the read and write centers have the correct orientation or position with respect to one another.

As shown in FIG. 1, centers 17 and 18 are slightly offset. The offset is exaggerated for ease of illustration. As misalignment between centers 17 and 18 increases, the read error rate will increase as a result of the off track capabilities of magnetic head 10 decreasing. If centers 17 and 18 are aligned correctly, the read error rate of magnetic head 10 will decrease because MR read transducer 15 will be reading data from the correct portions of the magnetic media tracks that have been written to by write transducer 13. This invention does not directly deal with the alignment of the top pole. The top pole mask can be aligned to either the contact or MR mask, The present invention deals with determining the misalignment of the MR and contact layers across the wafer.

As discussed above, alignment of the contact layer and the MR element layer is very important in the fabrication of MR recording heads. This is particularly true of MR recording heads with slanted contacts and asymmetric non-rectangular MR element shapes as shown in FIG. 1. Shifts of center 17 of MR element 16 in the x direction (the direction parallel to the lengthwise dimension of MR element 16) result in misalignment in the x direction with center 18 of write transducer 13 as well. This misalignment in the x direction has a negative effect on the off track capabilities of most MR head designs. However, in the slanted contact design of MR read transducer 15 as shown in FIG. 1, misalignment in a second direction between MR element 16 and contacts 19 and 20 has a similar effect. Because of the slanted contact design, misalignment of MR element 16 with contacts 19 and 20 in a y direction (the direction perpendicular to the x direction) Will result in movement of center 17 of MR element 16 in both the x and y directions. Therefore, misalignment of MR element 16 and contacts 19 and 20 in either the x or y directions results in movement of center 17 in the x direction and a corresponding reduction in off track capabilities as centers 17 and 18 be come misaligned. The method of determining alignment between contacts and MR elements in accordance with the present invention can be used with slanted contact and straight sided contact MR head designs.

In preferred embodiments. MR element 16 is made of a magnetoresistive material such as permalloy (NiFe) with a characteristic sheet resistivity of $\rho^S_{NiFe}$, where sheet resistivity is in units of ohms per square. The resistance of a material is equal to its sheet resistivity multiplied by the number of squares traversed by the current. The number of squares is defined as the length of the material along the current flow direction divided by the width of the material across the current flow direction, Contacts 19 and 20 are preferably made from a low resistivity metal such as Au, which has a characteristic sheet resistivity $\rho^S_{Au}$ which is much less than the characteristic sheet resistivity $\rho^S_{NiFe}$ of MR element 16. It will be understood, that in this application, Au is used generically to refer to a composite film having a center film of Au and substantially thinner top and bottom layers of a refractory metal such as Mo. Sheet resistivity of the composite film is generically referred to as $\rho^S_{Au}$. Although in preferred embodiments. MR element 16 is made of permalloy and contacts 19 and 20 are made of a Mo/Au/Mo composite film, in other preferred embodiments, other materials could be used. Examples of other contact materials include, but are not restricted to, Cu, Ag, Ta, Mo, W, or composite sandwiches of any of these metals. In practice, the lower the resistivity of the contact material relative to the resistivity of the MR element material, the better the device will function. Although this application discusses the method of the present invention with respect to the characteristic sheet resistivity $\rho^S_{NiFe}$ of permalloy and the characteristic sheet resistivity $\rho^S_{Au}$ of Au, it is clear that the present invention works well in alternate embodiments by substituting the appropriate characteristic sheet resistivities of other contact materials.

Figure 2:
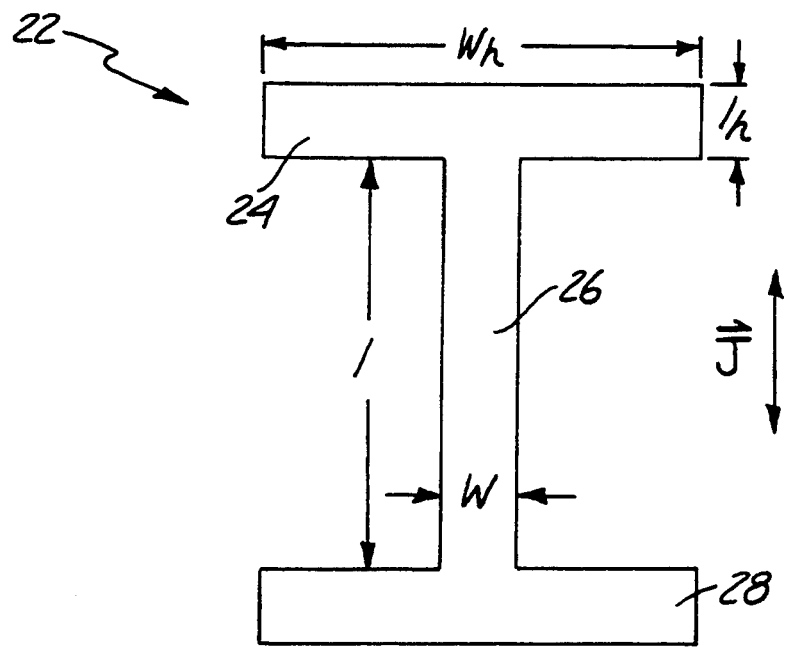
FIG. 2 is a diagrammatic view of an MR test feature for determining alignment between the MR element layer and the contact layer of an MR head.
Figure 3:
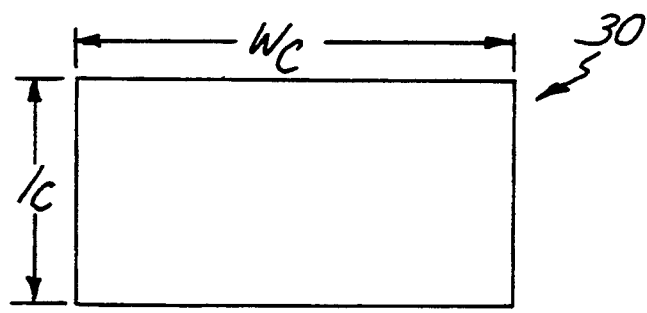
FIG. 3 is a diagrammatic view of a contact test feature for use in determining alignment between the MR element layer and the contact layer of an MR head.

FIGS. 2 and 3 show elements of the test features for use in determining relative alignments of reticles from one layer to the next in the fabrication of transducers such as MR read transducer 15 of magnetic head 10. The test features shown in FIGS. 2 and 3 are used as part of the row(s) of test features which are typically placed on each reticle to determine whether the fabrication process is working properly. The letter J shows the direction of current flow.

FIG. 2 shows MR element test feature 22. Test feature 22 has three sections which are joined in a dogbone shape. First section 24 has a width $w_h$ and a length $1_h$. Second section 26 joins first section 24 and third section 28. Second section 26 has a width w and a length 1. Finally, third section 28 has dimensions which are the same as those of first section 24.

MR element test feature 22 is made from the same material as MR element 16 of other magnetic heads on the wafer. Therefore, in preferred embodiments, test feature 22 is made from permalloy and has a characteristic sheet resistivity of $\rho^S_{NiFe}$. As will be shown below with reference to Equation 1, the dimensions and shape of test feature 22 are such that most of the resistance of test feature 22 comes from second section 26. Very small portions of the total resistance are a result of first and third sections 24 and 28.

FIG. 3 illustrates contact test feature 30. In preferred embodiments, contact test feature 30 is in a rectangular shape having a width $w_c$ and a length $1_c$. Contact test feature 30 is preferably made from the same material as contacts 19 and 20. Therefore, in preferred embodiments, contact test feature 30 has the characteristic sheet resistivity $\rho^S_{Au}$ of Au. Preferably, the characteristic sheet resistivity of contact test feature 30 is much less than the characteristic sheet resistivity of MR element test feature 22.

The resistance $R^o$ of MR element test feature 22 can be shown to be equal to the right side of Equation 1 if the thickness of feature 22 remains constant.

$$R^o = \rho^s_{NiFe} \cdot \frac{l}{w} + 2 \cdot \rho^s_{NiFe} \cdot \frac{l_h}{w_h} \qquad \text{Equation 1}$$

where,
$\rho^S_{NiFe}$ equals the sheet resistivity of permalloy (NiFe) in ohms per square (# of squares = length along the direction of current flow divided by width along the direction of current flow);
1 is the length of section 26;
w is the width of section 26;
$1_h$ is the length of sections 24 and 28;
$w_h$ is the width of sections 24 and 28.

As can be seen, since the ratio of length 1 to width w of second section 26 is much greater than the ratio of length $1_h$ to width $w_h$ of first and third sections 24 and 28, resistance $R^o$ of test feature 22 is comprised primarily of resistance associated with section 26. In preferred embodiments, 1 is much greater than $1_h$, and $w_h$ is much greater than w. This helps to increase the dependence of resistance $R^o$ on the resistance associated with section 26. As will be discussed next, this is an important feature of the present invention.

Figure 4:
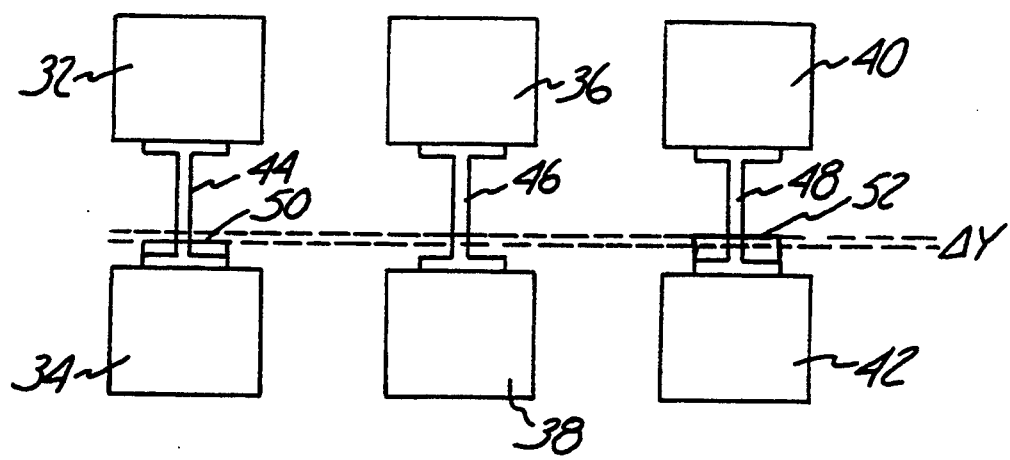
FIG. 4 is a diagrammatic view of the MR and contact test features shown in FIGS. 2 and 3, illustrating misalignment of the contact mask layer and the MR element layer.

FIG. 4 is a diagrammatic view of several MR element and contact test features. FIG. 4 is intended to illustrate the basic principles of the method and test features of the present invention. Elements 32, 34, 36, 38, 40 and 42 are referred to as contact pads. These elements are also referred to as contacts, while elements 50 and 52 are referred to as contact test features. Contact test features 50 and 52 are integrally formed portions of contacts 34 and 42, respectively. The contacts or contact pads are actually part of a multilayered structure which is built up throughout the wafer fabrication process so that probe tips from an electrical tester can make electrical contact with the test features that, by the end of the wafer build process, are deeply buried within the wafer.

Figure 5:
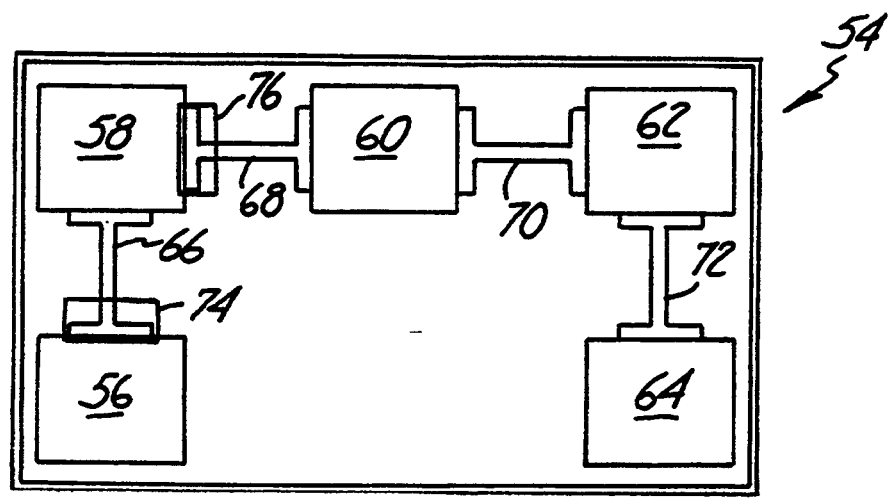
FIG. 5 is a diagrammatic view of a test feature arrangement in accordance with the present invention for detecting misalignment of the MR element and contact layers in two directions.

For purposes of illustration, contacts 32, 34, 36, 38, 40 and 42 are grouped in sets of two with one of the MR element test features 44, 46 or 48 connecting each pair. However, as shown in FIG. 5, in the actual test feature configuration of the present invention, MR element test features would also extend horizontally (in the x direction) between one or more pairs of contacts such as contacts 32 and 36. Having MR element test features extend between contacts in two generally perpendicular directions allows misalignment to be determined in each of these two directions.

In actual fabrication of the test features, MR element test features 44, 46 and 48 are formed from the same material and at the same time as MR elements on the wafer. Therefore, test features 44, 46 and 48 are formed from permalloy with the use of a first photoresist mask or photomask. Test features 44, 46 and 48 are identical in construction to test feature 22 shown in FIG. 3. Subsequently, contact test features 32, 34, 36, 38, 40 and 42 are formed from a low resistance contact material such as an Au composite using a second photoresist mask. Actual contacts on MR heads throughout the reticle are formed at the same time and from the same material as the contact test features using the second photoresist mask. Contact test features 50 and 52 are similar in construction to contact test feature 30 shown in FIG. 3 and are simply extensions of contacts 34 and 42, respectively.

Ideally, MR element test features 44 and 48 have correctly aligned connections with their respective contacts. This condition, represented by the lower of the two dashed lines in FIG. 4, is indicative of correct alignment between MR element and contact layers on MR heads fabricated on the wafer using the same reticles. MR element test feature 44, contacts 32 and 34, and contact test feature 50 are shown to illustrate a well aligned group of test features. Test feature 44 is intended to be shown in correct alignment with respect to contact 50. When test feature 44 is perfectly aligned with contact 34, contact test feature 50 extends into the narrow portion of test feature 44 (corresponding to section 26 of test feature 22 shown in FIG. 2) because length $l_c$ of contact test feature 50 is greater than length $l_h$ of MR test feature 44. When properly aligned, contact test feature 50 overlaps the MR element test feature 44. The amount of overlap of contact test feature 50 into the narrow portion of test feature 44 is therefore the difference between $l_c$ and $l_h$. Because the characteristic sheet resistivity $\rho^S_{Au}$ of test feature 50 is less than the characteristic sheet resistivity $\rho^S_{NiFe}$ of test feature 44, any overlap of test feature 44 by test feature 50 results in a reduction in a resistance value associated with test feature 44. Since the sheet resistivity $\rho^S_{NiFe}$ of the MR film varies across the wafer, MR element test feature 46 and contacts 36 and 38 are included to compensate for this variation. The measured resistance values for the test feature 44 are divided by the measured resistance values of test feature 46.

MR element test feature 48, contacts 40 and 42, and contact test feature 52 are shown to illustrate misalignment between test feature 48 and contacts 40 and 42 in the y direction, and therefore represents misalignment between the MR element and contact layers throughout the reticle in the same direction. As can be seen in FIG. 4, contact test feature 52 extends further into the narrow portion of test feature 48 than does contact feature 50 into the narrow portion of test feature 44. The further overlap of contact test feature 52 on top of test feature 48 illustrates the change of position between the contact layer and the MR element layer. It must be noted that typically, misalignment of a test feature would indicate misalignment of the MR layer and the contact layer throughout the reticle. Placing aligned test features such as 32, 34, 44 and 50 next to misaligned test features such as 40, 42, 48 and 52 is for illustration only. As can be seen, the misalignment causes contact test feature 52 to extend further over MR element test feature 48 than test feature 50 does over test feature 44 by a distance of $\Delta y$. As referred to earlier, because contact test features 50 and 52 are designed to extend over the narrower portions of MR element test features 44 and 48, respectively, small changes $\Delta y$ in alignment cause easily detectable changes in the resistance value associated with test feature 48 from the resistance value associated with test feature 44.

Resistance $R^o$ of Equation 1 was determined using an MR element test feature such as 46 and contacts such as 36 and 38, without any contact test feature extension over the narrow portion of the MR element test feature. $R^o$ is determined in the this manner because misalignment between contacts 36 and 38 and MR element test feature 46 is extremely unlikely to cause either contact 36 or contact 38 to overlap onto the narrow portion of the MR element test feature 46. Therefore, as discussed above, the change in resistance of MR element test feature 46 due to misalignment will be very slight.

The resistance of an MR element test feature and contact structure (including a contact test feature such as feature 52) with the MR element test feature extending between two contacts in the y direction can be shown to be equal to the right side of Equation 2:

$$R^y = \rho^S_{NiFe} \cdot \left[ \frac{l + l_h - (l_c + \Delta y)}{w} \right] + \rho^S_{NiFe} \cdot \frac{l_h}{w_h} + \rho^S_{Au} \cdot \left[ \frac{l_c + \Delta y}{w_c} \right] \quad \text{Equation 2}$$

where
$\rho^S_{Au}$ is the characteristic sheet resistivity of the Au composite (in ohms per square); and
$\Delta y$ is the misalignment of the contact test and the MR element test in the y direction.

The ratio of the resistances $R^y$ to $R^o$ is:

$$\frac{R^y}{R^o} = \frac{\rho^S_{NiFe} \cdot \left[ \frac{l + l_h - (l_c + \Delta y)}{w} \right] + \rho^S_{NiFe} \cdot \frac{l_h}{w_h} + \rho^S_{Au} \cdot \left[ \frac{l_c + \Delta y}{w_c} \right]}{\rho^S_{NiFe} \cdot \frac{l}{w} + 2 \cdot \rho^2_{NiFe} \cdot \frac{l_h}{w_h}} \quad \text{Equation 3}$$

$$= \frac{\left[\frac{l + l_h - (l_c + \Delta y)}{w}\right] + \frac{l_h}{w_h} + \frac{\rho^w_{Au}}{\rho^s_{NiFe}} \cdot \left[\frac{l_c + \Delta y}{w_c}\right]}{\frac{l}{w} + 2 \cdot \frac{l_h}{w_h}}$$

Equation 3 can be simplified by substituting in $\alpha$ and $\omega$ from Equations 4 and 5 below.

$$\alpha = \frac{\rho^s_{Au}}{\rho^s_{NiFe}} \quad \text{Equation 4}$$

where,
$\alpha$ is the sheet resistance ratio (approximately 0.1).

$$\omega = \frac{w}{w_h} \approx \frac{w}{w_c} \quad \text{Equation 5}$$

where, in preferred embodiments,
$w_c \approx w_h$; and
$\omega$ is much less than 1.

After substitution, the ratio shown in Equation 3 can be approximated as shown in Equation 6-A.

$$\frac{R^y}{R^o} = \frac{l + l_h - (l_c + \Delta y) + \omega l_h + \alpha \omega (l_c + \Delta y)}{l + 2\omega l_h} \quad \text{Equation 6-A}$$

Equation 6 can be simplified by noting that $\alpha \cdot \omega \ll 1$ so that Equation 6 may be rewritten as Equation 6-B:

$$\frac{R_y}{R_o} \approx \frac{l + l_h(1 + \omega) - l_c + \Delta y}{l + 2\omega l_h} \quad \text{Equation 6-B}$$

Using Equation 6-B to solve for the degree or amount of misalignment $\Delta y$ in the y direction, $\Delta y$ is approximated as shown in Equation 7.

$$\Delta y = l\left[\frac{R^y}{R^o} - 1\right] + l_h\left[\omega\left(\frac{2R^y}{R^o} - 1\right) - 1\right] + l_c \quad \text{Equation 7}$$

Because of the choice of relative sheet resistance of NiFe and Au, and because of appropriate choice of test structure geometry, neither Au nor NiFe sheet resistance variation shows up in the expression for $\Delta y$. This eliminates a source of error that would otherwise make an accurate determination of $\Delta y$ impossible.

As will be discussed with reference to FIG. 5 below, MR element and contact test features which are oriented perpendicular to the test features shown in FIG. 4 are used to determine misalignment $\Delta x$ in the x direction. In a manner almost identical to that described above, misalignment $\Delta x$ in the x direction can approximated as is shown below in Equation 8.

$$\Delta x = l\left[\frac{R^x}{R^o} - 1\right] + l_h\left[\omega\left(\frac{2R^x}{R^o} - 1\right) - 1\right] + l_c \quad \text{Equation 8}$$

where,
$R^o$ is the resistance of a horizontally positioned MR element test feature; and
$R^x$ is the resistance of a horizontally positioned MR element test feature including contacts and a contact test feature.

Although both misalignment $\Delta y$ in the y direction and misalignment $\Delta x$ in the x direction are described in Equations 7 and 8 as being dependent upon a commonly defined resistance $R^o$ of an MR element test feature, in preferred embodiments, two separate MR element test feature resistances $R^o_y$ and $R^o_x$ would be used in the calculations of $\Delta x$ and $\Delta y$. Just as $R^o_y$ is measured from an MR element test feature (such as feature 46 in FIG. 4) with its lengthwise dimension positioned parallel to the y direction, $R^o_x$ is measured from an MR element test feature (such as feature 70 in FIG. 5) positioned parallel to the x direction. Measuring separate MR element test feature resistance values for the y and x directions prevents miscalculations which could result from misalignment occurring in one direction but not the other.

FIG. 5 is a diagrammatic view of test feature arrangement 54 in accordance with the present invention for detecting misalignment of the MR element and contact layers in the x and y directions. Arrangement 54 occupies at least a portion of the test feature positions of a photoresist mask or reticle. Arrangement 54 includes contacts 56, 58, 60, 62 and 64, MR element test features 66, 68, 70 and 72, and contact test features 74 and 76. No test features connect contacts 56 and 64 so that an open circuit exists. The open circuit allows resistances between any two contacts to be easily determined.

For purposes of determining misalignment in the y direction, resistance $R^o_y$ is measured across MR element test feature 72 which does not have a corresponding contact test feature (such as contact test feature 30 in FIG. 3). The absence of a contact test feature with low resistivity extending over the narrow portion of MR element test feature 72 causes the resistance $R^o_y$ of feature 72 to be relatively unaffected by misalignment of the MR and contact layers. Resistance $R^y$ of an MR element test feature and contact structure (including a contact test feature) is measured across MR element test feature 66, with contact test feature 74 over extending into the narrow portion of test feature 66 by a distance of $\Delta y$. Equation 7 is then used to determine the amount of misalignment $\Delta y$ in the y direction. Since contacts 56, 58, 60, 62 and 64 provide very little resistance, $R^o_y$ and $R^y$ can be approximated by measuring the resistance between contacts 62 and 64, and between contacts 56 and 58, respectively.

Misalignment $\Delta x$ in the x direction is determined in a very similar manner by utilizing Equation 8. $R^o_x$ is measured across MR element test feature 70. Resistance $R^x$ of an MR element test feature and contact structure (including a contact test feature) is measured across MR element test feature 68. Misalignment $\Delta x$ in the x direction is then equivalent to the distance that contact test feature 76 over extends into the narrow portion of MR element test feature 68. As discussed above with reference to $R^o_y$ and $R^y$, $R^o_x$ and $R^x$ can be closely approximated by measuring the resistances between contacts 60 and 62 and between contacts 58 and 60, respectively.

Figure 6:
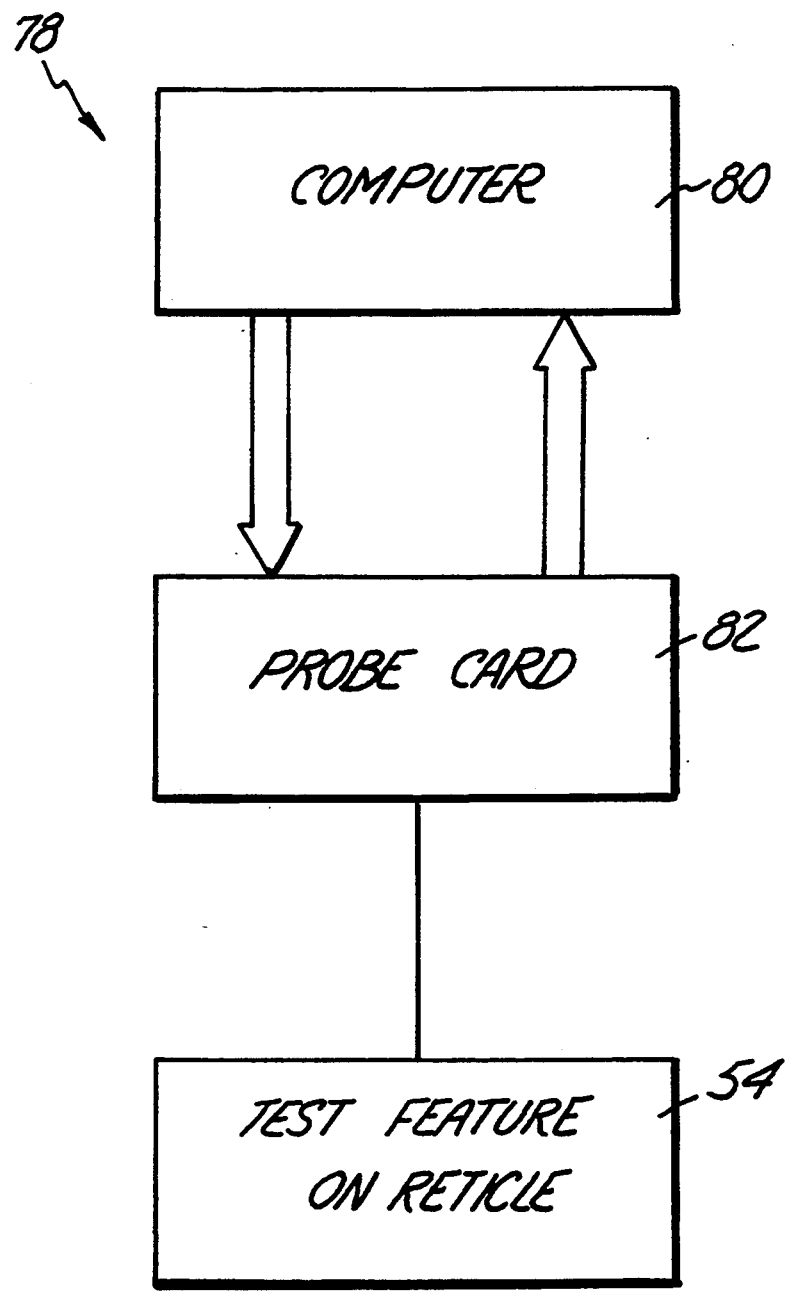
FIG. 6 is a block diagram of a system for determining misalignment of the MR element and contact layers of MR heads in accordance with the methods of the present invention.

FIG. 6 is a block diagram of a system for determining misalignment of the MR element and contact layers of MR heads in accordance with the methods of the present invention. System 78 includes test feature or arrangement 54 on a reticle, probe card 82 and computer 80. In actual use, test feature or arrangement 54 on a reticle is used repetitively as the stepper motor moves the reticle from one position on a wafer to the next position on the same wafer.

Probe card 82 contains test probes which are placed in contact with bond pads formed on the wafer as defined by the reticle. As discussed previously, the contact pads are part of the bond pads. Probe card 82 is used to measure voltages from one contact to the next on test feature 54 as a constant current is applied. In this manner, the effective resistances between the contacts can be determined. This is in turn indicative of a resistance value associated with the MR element test features. In preferred embodiments, resistance values $R^o_y$, $R^o_x$, $R^y$ and $R^x$ are all determined in this manner. Because the resistances (and thus the misalignment) are measured electrically, the method of determining misalignment of the present invention is not labor intensive. Also, using the electrical method of the present invention, likelihood of human error is low. Probe card 82 may be moved throughout the wafer either manually or automatically to test features fabricated during multiple placements of the reticle.

Computer 80 is, in preferred embodiments, a microprocessor-based computer including associated memory and associated input/output circuitry. However, computer 80 could be any other type of computational device such as a programmable logic controller (PLC). In fact, computer 80 need not be present at all. Based upon resistances or voltages measured by probe card 82, misalignment between the MR element and contact mask layers can be determined using the method of the present invention.

Using system 78, misalignments $\Delta x_i$ and $\Delta y_i$ for each of N separate reticle placements on the water may be determined. The misalignment data can then be analyzed to determine whether misalignment in the x and-/or y direction(s) is occurring randomly or according to some predictable pattern. Wafer size changes due to thermal expansion will cause misalignment throughout the entire wafer, a phenomenon often referred to as "run-out". Also, if the MR mask is a contact mask as opposed to a stepper mask, the MR layer and the contact layer may be rotated relative to one another by angle $\Theta$. The misalignment data $\Delta y_i$ and $\Delta x_i$ from throughout the wafer may be used in optimization routines and transformed into descriptions of run-out and angular misorientation. In this way, misalignment can be detected at the wafer level, allowing early corrective action and easier understanding of performance data of the MR head during testing drive.

Although the present invention has been described with reference to preferred embodiments, workers skilled in the art will recognize that changes may be made in form and detail without departing from the spirit and scope of the invention. For example, a plurality of test structures can be employed at several locations on the wafer to test for misalignment at several locations to thereby map misalignment to permit realignment of subsequent layers. Also, although determinations of misalignment are described herein as ratios of two resistance values, they can, in alternate embodiments, be defined as the change with reference to a single resistance value from a norm or reference resistance.

What is claimed is:

1. A device for determining alignment accuracy between magnetoresistive elements and contacts of magnetoresistive heads formed on a wafer, the magnetoresistive elements being parts of a first layer formed using a first photomask, the contacts being parts of a second layer formed using a second photomask, the device comprising:

a first alignment test structure defined using the first photomask, the first alignment test structure formed from a first material having a first characteristic sheet resistivity;

a second alignment test structure defined using a second photomask, the second alignment test structure formed from a second material having a second characteristic sheet resistivity lower than the first characteristic sheet resistivity, the second alignment test structure formed to be in contact with the first alignment test structure;

means for determining a first resistance value, the first resistance value being dependent upon the first and second characteristic sheet resistivities and upon alignment between the first alignment test structure and the second alignment test structure; and means for determining alignment between the first alignment test structure and the second alignment test structure as a function of the first resistance value, alignment between the first and second alignment test structures being indicative of alignment between magnetoresistive elements and contacts of magnetoresistive heads formed on the wafer.

2. The device of claim 1, wherein the means for determining alignment between the first alignment test structure and the second alignment test structure as a function of the first resistance value comprises:

means for determining alignment between the first alignment test structure and the second alignment test structure as a function of both the first resistance value and a reference resistance value.

3. The device of claim 2 wherein the reference resistance value is a predetermined resistance value.

4. The device of claim 2 and further comprising:

means for determining the reference resistance value, the reference resistance value being associated with a third alignment test structure defined using the first photomask and formed from the first material having the first characteristic resistivity.

5. The device of claim 1, wherein the first material is NiFe.

6. The device of claim 1, wherein the second material is an Au composite material.

7. A method of determining alignment accuracy between magnetoresistive elements and contacts of magnetoresistive heads formed on a wafer, the magnetoresistive elements being parts of a first layer defined using a first photoresist mask, the contacts being parts of a second layer defined using a second photoresist mask, the first layer being formed from a first material having a first characteristic sheet resistivity, the second layer being formed from a second material having a second characteristic sheet resistivity which is lower than the first characteristic sheet resistivity, the method comprising:

defining a first alignment test structure on the wafer using the first photoresist mask, the first alignment test structure being part of the first layer and being formed from the first material having the first characteristic sheet resistivity;

defining a second alignment test structure on the wafer using the second photoresist mask, the second alignment test structure being part of the second layer and being formed from the second material having the second characteristic sheet resistivity, the second alignment test structure formed to be in contact with the first alignment test structure;

determining a first resistance value, the first resistance value being dependent upon the first and second characteristic sheet resistivities and upon alignment between the first alignment test structure and the second alignment test structure; and determining alignment information as a function of the first resistance value, the alignment information being indicative of alignment between magnetoresistive elements and contacts of magnetoresistive heads formed on the wafer.

8. The method of claim 7, wherein determining alignment information as a function of the first resistance value comprises:

determining alignment information as a function of both the first resistance value and a reference resistance value.

9. The method of claim 8, wherein the reference resistance value is a predetermined resistance value.

10. The method of claim 8 and further comprising:

defining a third alignment test structure on the wafer using the first photoresist mask, the third alignment test structure being part of the first layer and being formed from the first material having the first characteristic sheet resistivity; and determining the reference resistance value, the reference resistance value being associated with the third alignment test structure.

* * * * *

UNITED STATES PATENT AND TRADEMARK OFFICE
CERTIFICATE OF CORRECTION

PATENT NO. : 5,390,420
DATED : February 21, 1995
INVENTOR(S) : ALLAN E. SCHULTZ

It is certified that error appears in the above-indentified patent and that said Letters Patent is hereby corrected as shown below:

Col. 3, line 21, delete "be come", insert --become--

Col. 6, line 5, delete "layers:", insert --layers--

Signed and Sealed this

Ninth Day of May, 1995

*Attest:*

BRUCE LEHMAN

*Attesting Officer*  *Commissioner of Patents and Trademarks*